(12) United States Patent
Maekawa

(10) Patent No.: US 10,401,430 B2
(45) Date of Patent: Sep. 3, 2019

(54) SEMICONDUCTOR INTEGRATED CIRCUIT AND SEMICONDUCTOR INTEGRATED CIRCUIT DIAGNOSIS METHOD

(71) Applicant: Kabushiki Kaisha Toshiba, Minato-ku, Tokyo (JP)

(72) Inventor: Tomoyuki Maekawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 57 days.

(21) Appl. No.: 15/691,121

(22) Filed: Aug. 30, 2017

(65) Prior Publication Data

US 2018/0275198 A1 Sep. 27, 2018

(30) Foreign Application Priority Data

Mar. 21, 2017 (JP) ................. 2017-054930

(51) Int. Cl.
*G01R 31/317* (2006.01)
*G06F 11/267* (2006.01)
*G01R 31/3185* (2006.01)

(52) U.S. Cl.
CPC ............ *G01R 31/318544* (2013.01); *G01R 31/31724* (2013.01); *G01R 31/318533* (2013.01); *G01R 31/318536* (2013.01); *G01R 31/318566* (2013.01); *G01R 31/318575* (2013.01); *G06F 11/267* (2013.01)

(58) Field of Classification Search
CPC ...... G01R 31/318544; G01R 31/31724; G01R 31/318566; G01R 31/318575; G01R 31/318536; G01R 31/318533; G06F 11/267

See application file for complete search history.

(56) References Cited

U.S. PATENT DOCUMENTS 6,691,268 B1   2/2004  Chin
8,296,703 B1  10/2012  Chakravadhanula et al.
8,841,952 B1 *  9/2014  Singh .................. H03K 3/0372
                                                                326/93
(Continued)

FOREIGN PATENT DOCUMENTS

JP   2004-093351 A    3/2004
JP   2004-325124 A   11/2004
(Continued)

OTHER PUBLICATIONS

Extended European Search Report dated Mar. 29, 2018 in corresponding European Patent Application No. 17188108.9.

*Primary Examiner* — Thien Nguyen
(74) *Attorney, Agent, or Firm* — White & Case LLP

(57) ABSTRACT

A semiconductor device according to an embodiment includes a plurality of scan chains each including a retention flip-flop, and a control section configured to perform restoration of data saved in a retention section of each retention flip-flop by reading the data from the retention section and after the data restoration, perform diagnosis of the retention flip-flops by performing comparison to determine whether or not an expected value of an output data string obtained as a result of a scan shift in the plurality of scan chains before the save and a value of an output data string obtained as a result of a scan shift of data in the plurality of scan chains after the restoration.

8 Claims, 10 Drawing Sheets

(56) References Cited

U.S. PATENT DOCUMENTS

| | | |
|---|---|---|
| 9,064,596 B2 | 6/2015 | Kurokawa |
| 2003/0188241 A1 | 10/2003 | Zyuban et al. |
| 2009/0326854 A1* | 12/2009 | Chakravadhanula ........................ G01R 31/318575 702/119 |
| 2010/0308876 A1* | 12/2010 | Kawasaki ............. G06F 1/3203 327/143 |
| 2014/0289576 A1* | 9/2014 | Maekawa ...... G01R 31/318544 714/727 |
| 2016/0111170 A1* | 4/2016 | Zhao .................. G01R 31/3177 714/719 |
| 2016/0359472 A1* | 12/2016 | Kim .................... H03K 3/0375 |

FOREIGN PATENT DOCUMENTS

| | | |
|---|---|---|
| JP | 2006-349548 A | 12/2006 |
| JP | 2010-282411 A | 12/2010 |
| JP | 2014-207434 A | 10/2014 |

\* cited by examiner

SEMICONDUCTOR INTEGRATED CIRCUIT AND SEMICONDUCTOR INTEGRATED CIRCUIT DIAGNOSIS METHOD

CROSS-REFERENCE TO RELATED APPLICATION

This application is based upon and claims the benefit of priority from the prior Japanese Patent Application No. 2017-054930 filed in Japan on Mar. 21, 2017; the entire contents of which are incorporated herein by reference.

FIELD

Embodiments described herein relate generally to a semiconductor integrated circuit and a semiconductor integrated circuit diagnosis method.

BACKGROUND

Conventionally, a semiconductor device diagnosis technique utilizing a built-in self-test (BIST) for a logic circuit (hereinafter referred to as "logic BIST") has been widely used. A logic BIST may be conducted not only in initial diagnosis at the time of start-up of a semiconductor device, but also in regular diagnosis during operation of the semiconductor device.

Also, a technique using retention flip-flops for restoration of respective data in a semiconductor device has been proposed.

Each retention flip-flop includes a main unit and a retention section, and before power shut-down, can save data in the retention section and after power recovery, restore the data in the main unit from the saved data in the retention section.

However, where retention flip-flops are used for diagnosis of a semiconductor device, if a defect or a failure occurs in retention performance of the retention sections and/or save operation and restoration operation of the retention flip-flops, data is not correctly restored. Conventionally, no method for diagnosis of such retention performance of retention sections and save operation and restoration operation of retention flip-flops has been proposed.

DETAILED DESCRIPTION

A semiconductor integrated circuit according to an embodiment includes: at least one scan chain including a retention flip-flop; and a diagnosis circuit configured to perform restoration of data saved in a retention section of the retention flip-flop by reading the data from the retention section, and after the restoration of the data, perform diagnosis of the retention flip-flop by performing comparison to determine whether or not a first value of a first output data string obtained as a result of a scan shift in the at least one scan chain before the save and a second value of a second output data string obtained as a result of a scan shift of the data in the at least one scan chain after the restoration agree with each other.

Embodiments will be described below with reference to the drawings.

First Embodiment (Configuration)

Figure 1:
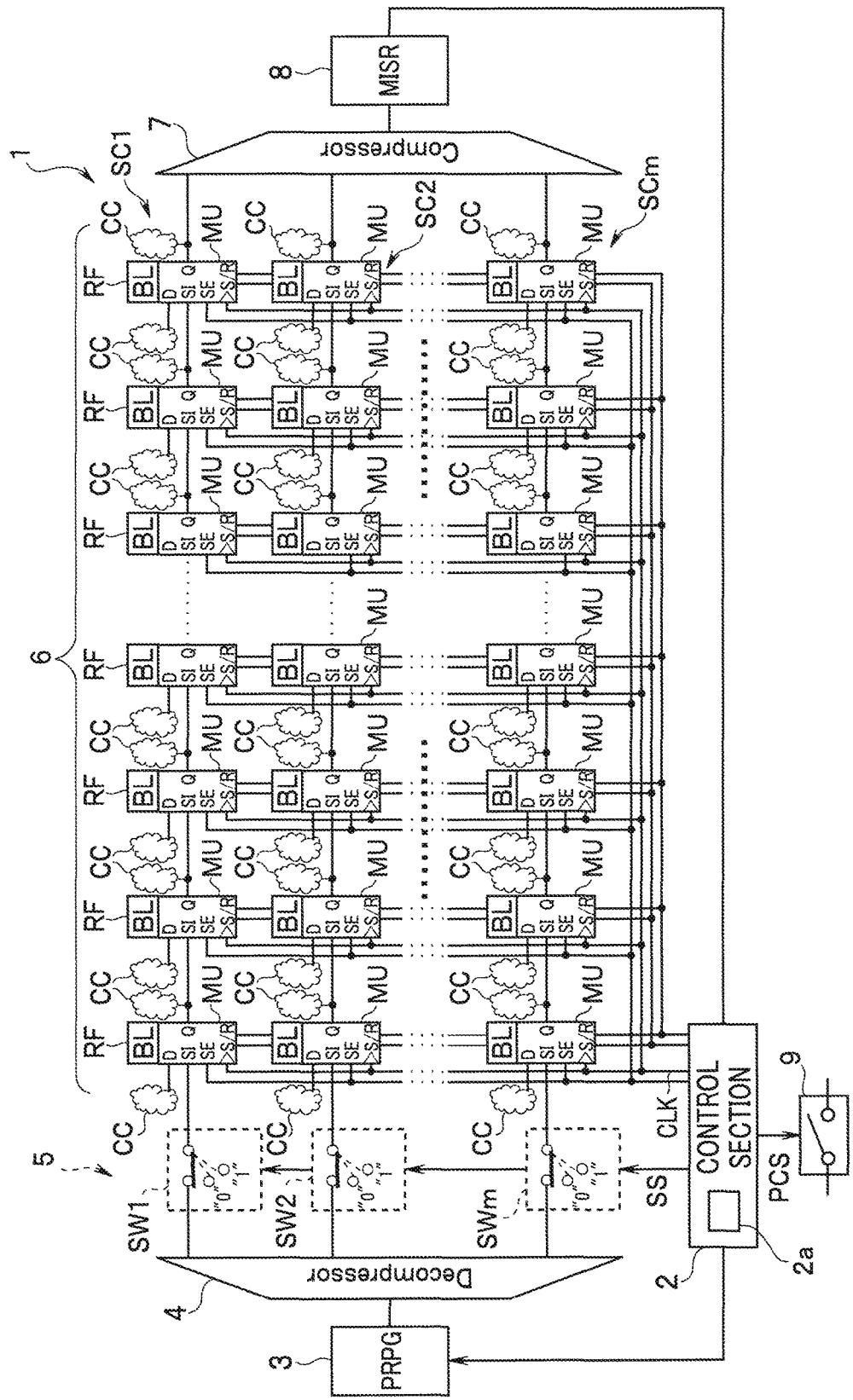
FIG. 1 is a circuit block diagram of a semiconductor device according to a first embodiment.

FIG. 1 is a circuit block diagram of a semiconductor device according to a first embodiment.

A semiconductor device 1 is a semiconductor integrated circuit including a plurality of combination circuits CC each configuring a logic section, and the semiconductor device 1 has a logic BIST function.

The semiconductor device 1 includes a control section 2, a pattern generation circuit (PRPG: pseudo random pattern generator) 3, a decompressor 4, a selector 5, a plurality of scan chains 6, a compressor 7, a multiple input signature register (hereinafter abbreviated as MISR) 8 in addition to the plurality of combination circuits CC. The control section 2 includes a logic BIST controller 2a for a logic BIST.

Furthermore, the control section 2 can output a power control signal PCS for controlling a power switch 9 for controlling supply of power to the semiconductor device 1, which is a semiconductor chip.

In the semiconductor device 1, the plurality of scan chains 6 for a logic BIST are formed. Only a single scan chain 6 may be provided.

In FIG. 1, the plurality of scan chains 6 include m (m is a positive integer) scan chains SC1 to SCm. Hereinafter, one arbitrary scan chain or all scan chains of the m scan chains SC1 to SCm refer to scan chain(s) SC. Here, each of the scan chains SC1 to SCm configures a scan shift path formed by cascade connection of a plurality of retention flip-flops RF in the logic sections. Each retention flip-flop RF is disposed between combination circuits CC, and can retain an inner state of the relevant logic section.

Although the retention flip-flops RF can be provided by various methods, for example, each retention flip-flop RF is provided by a configuration including a main unit MU and a retention section BL. The main unit MU, which is required to perform high-speed operation, includes a flip-flop including a transistor having a low threshold voltage. The retention section BL includes a flip-flop including a transistor having a high threshold voltage. Since the threshold voltage of the flip-flop in the main unit MU is low, the flip-flop operates at high speed but causes large leakage current. The flip-flop of the retention section BL operates slowly and retains the inner state with small leakage current.

The main unit MU includes six inputs, which are a D input, a shift-in (SI) input, a shift enable (SE) input, a clock (CLK) input, a store (S) input and a restore (R) input, and a Q output.

In each of the scan chains SC1 to SCm, a plurality of retention flip-flops RF are connected in a cascade form so that a Q output of a retention flip-flop RF is supplied to a shift-in (SI) input of a next retention flip-flop RF.

The D input, which is an output of a combination circuit CC, is retained in response to a clock (CLK) input, and is outputted as a Q output.

The shift-in (SI) input is retained in response to a shift enable (SE) input, and is outputted to the Q output.

The retention flip-flop RF retains the Q output in the retention section BL in response to the store (S) input.

The retention flip-flop RF reads and retains data retained in the retention section BL and outputs the data as the Q output, in response to the restore (R) input.

The control section 2 is a controller including a logic circuit, the controller performing processing for initial diagnosis of the logic sections at the time of start-up of the semiconductor device 1 and retention flip-flop diagnosis processing for confirming whether or not any defect occurs in, e.g., retention performance of the retention sections BL in the plurality of retention flip-flops RF. The initial diagnosis of the logic sections is performed by the logic BIST controller 2a.

Note that the control section 2 may be configured by a central processing unit (CPU), a ROM and a RAM so that programs stored in the ROM are executed by the CPU to perform processing for diagnosis of the logic sections and processing for diagnosis of the plurality of retention flip-flops RF.

The pattern generation circuit 3 is a pseudo random pattern generation circuit (PRPG) configured to generate a pseudo random pattern as a test pattern. The pseudo random pattern is pseudo random number data. The decompressor 4 decompresses the pseudo random number data and supplies the pseudo random number data to the selector 5.

The selector 5 includes a plurality of switches SW1 to SWm. The respective switches SW1 to SWm are provided corresponding to the plurality of scan chains SC1 to SCm, and are provided at respective test pattern input sections of the scan chains SC1 to SCm.

Each of the switches SW1 to SWm is a circuit configured to select a signal from the pattern generation circuit 3, "0" or "1", and output the selected signal to the relevant scan chain SC. Which signal to be selected and outputted by each of the switches SW1 to SWm is determined based on a selection signal SS from the control section 2. In other words, each of the switches SW1 to SWm configures a switching circuit configured to perform switching so as to fix inputs to the plurality of scan chains SC to 1 or 0, which is a predetermined value.

As described later, at the time of initial diagnosis of the logic sections, in each of the switches SW1 to SWm, the signal from the pattern generation circuit 3 is selected and outputted to the relevant scan chain SC. At the time of processing for diagnosis of the retention flip-flops RF, each of the switches SW1 to SWm selects "0" or "1", which is a fixed value, and supplies the selected "0" or "1" to the input section of the relevant scan chain SC.

The compressor 7 compresses the output data from the plurality of scan chains SC1 to SCm and outputs the data to the MISR 8.

The MISR 8 is an output response compressor including a register configured to be capable of retaining data with a width of a plurality of bits, the data storing an output of the compressor 7. Here, since a value (fixed value) of the MISR 8 where a scan shift is performed when a value of each retention flip-flop RF is "0" and a value (fixed value) of the MISR 8 where a scan shift is performed when the value of each retention flip-flop RF is "1" can be obtained by calculation, the control section 2 retains these two fixed values in advance in the circuit as expected values.

At the time of processing for diagnosis of the retention flip-flops RF, the control section 2 compares output data from the MISR 8 and these expected values to determine whether or not a failure occurs in the semiconductor device 1.

(Operation)

First, initial diagnosis of the logic sections will be described.

At the time of initial diagnosis of the logic sections, the control section 2 controls the logic BIST controller 2a, the pattern generation circuit 3 and the selector 5 to perform the initial diagnosis, and compares an output of the MISR 8 and expected values for initial diagnosis of the logic sections to perform diagnosis of the semiconductor device 1. A result of the diagnosis is outputted by the control section 2 to another CPU in the semiconductor device 1 or the outside. A test pattern for diagnosis of the logic sections is inputted from the selector 5 to each scan chain SC, and the logic BIST controller 2a performs diagnosis of the logic sections based on the test pattern.

More specifically, test pattern data from the pattern generation circuit 3 is set in the logic sections via the respective scan shift paths. Next, after the data is provided from the logic sections to the plurality of retention flip-flops RF, a test pattern is set in the plurality of retention flip-flops RF via the scan shift paths, and initial diagnosis of the logic sections is then performed by determining whether or not the value of the MISR 8 is a predetermined expected value.

Figure 2:
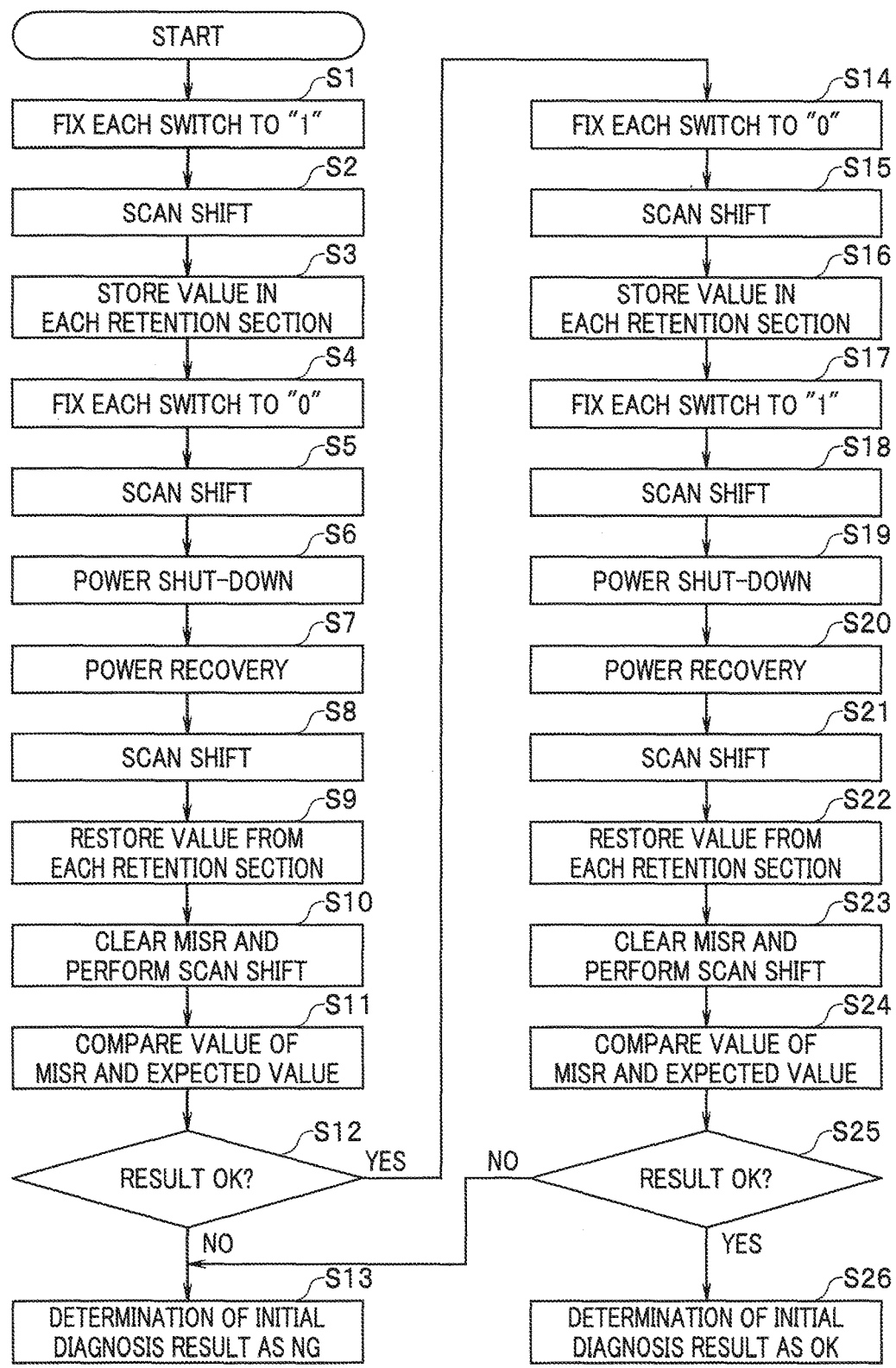
FIG. 2 is a flowchart illustrating an example of a flow of processing for initial diagnosis of retention flip-flops RF according to the first embodiment.

Next, processing for diagnosis of the retention flip-flops RF in the semiconductor device 1 will be described. FIG. 2 is a flowchart illustrating an example of a flow of processing for initial diagnosis of the retention flip-flops RF.

The control section 2 controls operation of the selector 5 and the plurality of scan chains 6 at the time of diagnosis of the retention flip-flops RF.

The semiconductor device 1 performs initial diagnosis of the respective retention flip-flops RF, which is described below, after or before performance of the above-described initial diagnosis using a logic BIST. Here, diagnosis of whether or not retention performance of the retention sections BL in the retention flip-flops RF and save operation and restoration operation of the retention flip-flops RF function correctly is performed.

As described above, when a logic BIST of logic sections that are general circuits is conducted, the control section 2 outputs a selection signal SS for switching of the respective switches SW1 to SWm to the selector 5 to select the signal from the pattern generation circuit 3 and the decompressor 4 and supply the signal to the respective scan chains 6.

On the other hand, at the time of diagnosis of the retention flip-flops RF, the control section 2 outputs a selection signal SS for switching of the respective switches SW1 to SWm to the selector 5 so as to select a fixed value of "0" or "1" and supply the fixed value to the respective scan chains 6.

Here, when the control section 2 performs diagnosis of retention performance of the retention sections BL in the respective retention flip-flops RF and save operation and restoration operation of the respective retention flip-flops RF, the control section 2 first outputs a selection signal SS for fixing an output of each switch SW to "1" to each switch SW (step (hereinafter abbreviated as "S") 1).

The control section 2 supplies a shift enable (SE) signal to the respective retention flip-flops RF a predetermined number of times to perform a scan shift so that each retention flip-flop RF of each scan chain SC retains "1" (S2). The predetermined number of times is a number of times required to retain "1" in each retention flip-flop RF in each scan chain SC. As a result of the processing in S2, "1" is retained in each switch SW.

The control section 2 supplies a store (S) signal to each retention flip-flop RF to store a value of the Q output in the retention section BL (S3).

Subsequently, the control section 2 outputs a selection signal SS for fixing an output of each switch SW to "0" to each switch SW (S4).

The control section 2 supplies a shift enable (SE) signal to the respective retention flip-flops RF a predetermined number of times to perform a scan shift so that each retention flip-flop RF in each scan chain SC retains "0" (S5). The number of times is a number of times that is equal to the number of times required to retain "1" in each retention flip-flop RF in each scan chain SC. As a result of the processing in S5, "0" is retained in each switch SW.

The control section 2 outputs a power control signal PCS for power-off to turn the power switch 9 off for power shut-down (S6).

Subsequently, the control section 2 outputs a power control signal PCS for power-on to turn the power switch 9 on for power recovery (S7).

Subsequently, the control section 2 supplies a shift enable (SE) signal to the respective retention flip-flops RF a predetermined number of times to perform a scan shift (S8). In this case, since the output of each switch SW is fixed at "0", as a result of the scan shift in S8, "0" is retained in each switch SW.

Then, in order to restore the value of the main unit MU to the value retained in the retention section BL, the control section 2 supplies a restore (R) signal to each retention flip-flop RF to restore the value from the retention section BL (S9).

If the value is correctly saved and retained in the retention section BL and correctly restored in response to the restore (R) signal, "1" is retained in the main unit MU of each retention flip-flop RF as a result of the restore.

The control section 2 clears the value of the MISR 8 and then supplies a shift enable (SE) signal to the respective retention flip-flops RF a predetermined number of times to perform a scan shift (S10).

The control section 2 reads the value of the register in the MISR 8 and compares the value of the MISR 8 and a predetermined expected value (S11). Here, the expected value where the value of "1" is restored in all the retention flip-flops RF and the value of the MISR 8 obtained by the scan shift in S10 are compared.

The control section 2 determines whether or not a result of the comparison between the value of the MISR 8 and the predetermined expected value is "OK", that is, whether or not the value of the MISR 8 and the predetermined expected value agree with each other (S12), and if the result of the comparison is "NG" (S12: NO), the control section 2 determines that a result of the initial diagnosis is "NG" (S13).

If the result of the comparison between the value of the MISR 8 and the predetermined expected value is "OK" (S12: YES), the control section 2 outputs a selection signal SS for fixing an output of each switch SW to "0" to each switch SW (S14).

The control section 2 supplies a shift enable (SE) signal to the respective retention flip-flops RF a predetermined number of times to perform a scan shift (S15) so that each retention flip-flop RF of each scan chain SC retains "0". As a result of the processing in S15, "0" is retained in each switch SW.

The control section 2 supplies a store (S) signal to each retention flip-flop RF to store the value of the Q output in the retention section BL (S16).

Subsequently, the control section 2 outputs a selection signal SS for fixing the output of each switch SW to "1" to each switch SW (S17).

The control section 2 supplies a shift enable (SE) signal to the respective retention flip-flops RF a predetermined number of times to perform a scan shift so that each retention flip-flop RF in each scan chain SC retains "1" (S18). As a result of the processing in S18, "1" is retained in each switch SW.

The control section 2 outputs a power control signal PCS to turn the power switch 9 off for power shut-down (S19).

Subsequently, the control section 2 outputs a power control signal PCS to turn the power switch 9 on for power recovery (S20).

Subsequently, the control section 2 supplies a shift enable (SE) signal to the respective retention flip-flops RF the predetermined number of times to perform a scan shift (S21). At this time, since the output of each switch SW is fixed at "1", "1" is retained in each switch SW.

Then, in order to restore the data of the main units MU to the data retained in the retention sections BL, the control section 2 supplies a restore (R) signal to the respective retention flip-flops RF to restore the data from the retention sections BL (S22).

If the data is correctly saved and retained in the retention sections BL and correctly restored in response to the restore (R) signal, "0" is retained in the main unit MU of each retention flip-flop RF as a result of the restore.

The control section 2 clears the data in the MISR 8 and subsequently supplies a shift enable (SE) signal to the respective retention flip-flops RF the predetermined number of times to perform a scan shift (S23).

The control section 2 reads the value of the register in the MISR 8 and compares the value of the MISR 8 and a predetermined expected value (S24). Here, the expected value when the value of "0" is restored in all retention flip-flops RF and the value of the MISR 8 obtained as a result of the scan shift in S23 are compared.

The control section 2 determines whether or not a result of the comparison between the value of the MISR 8 and the predetermined expected value is "OK", that is, the value of the MISR 8 and the predetermined expected value agree with each other (S25), and if the result of the comparison is "NG" (S25: NO), the control section 2 determines that a result of the initial diagnosis is "NG" (S13).

If the result of the comparison between the value of the MISR 8 and the predetermined expected value is "OK" (S25: YES), the control section 2 determines that the result of the initial diagnosis is "OK" (S26).

As described above, the control section 2 configures a diagnosis circuit configured to perform data restoration by restoring data (0 or 1) saved in the retention sections BL in the respective retention flip-flops RF from the retention sections BL, and after the data restoration, perform diagnosis of the retention flip-flops RF by performing comparison to determine whether or not a first value (expected value) of an output data string obtained as a result of a scan shift in the plurality of scan chains SC before the save, and a second value of an output data string obtained as a result of a scan shift of data in the plurality of scan chains SC after the restoration agree with each other.

The first value is an expected value of an output data string obtained by setting of a predetermined value (0 or 1) in inputs of the plurality of scan chains SC via the selector 5 and a subsequent scan shift of the predetermined value in the plurality of scan chains SC. The second value is a value of an output data string obtained by input of the predetermined value (0 or 1) restored from the retention sections BL to the plurality of can chains SC and a subsequent scan shift.

Then, the control section 2, which is a diagnosis circuit, performs diagnosis of the retention flip-flops RF by performing comparison to determine whether or not the first value and the second value agree with each other when the inputs to the plurality of scan chains SC are fixed to either one of "0" and "1" by the selector 5 and then performs diagnosis of the retention flip-flops RF by performing comparison to determine whether or not the first value and the second value agree with each other when the inputs to the plurality of scan chains SC are fixed to another of "0" and "1" by the selector 5.

As described above, the above-described embodiment enables provision of a semiconductor device and a semiconductor device diagnosis method capable of performing diagnosis of whether or not a defect or a failure occurs in retention performance of retention sections in retention flip-flops and save operation and restoration operation of the retention flip-flop, as initial diagnosis.

In particular, in the above-described example, restoration is performed after causing the retention flip-flops RF to retain each of "0" and "1", and a value of the MISR 8 and an expected value are compared, and thus, diagnosis of whether or not the retention section BL of each retention flip-flop RF can reliably retain both logical values of "0" and "1" can be performed.

Also, where the value of the main units MU and the value of the retention sections BL are in an inversion relationship, processing for restoration from the retention sections BL is performed, enabling determination of whether or not a failure occurs due to a transition failure in the retention sections BL.

Furthermore, since the power is shut down after "1" is stored in the respective retention sections BL and then "0" is shifted through the main units MU, whether or not a wrong value is retained in the retention sections BL or the main units MU because of a reaction of the power shut-down can be determined.

Note that, in order to completely ensure both transitions, that is, a transition from "0" to "1" and a transition from "1" to "0" in the retention sections BL of the retention flip-flops RF, S1 to S12 may further be performed after S1 to S25 are performed in FIG. 2.

Furthermore, although in the above-described embodiment, each switch SW can select "0" or "1", a toggle flip-flop may be used in consideration of interference with an adjacent flip-flop.

Figure 3:
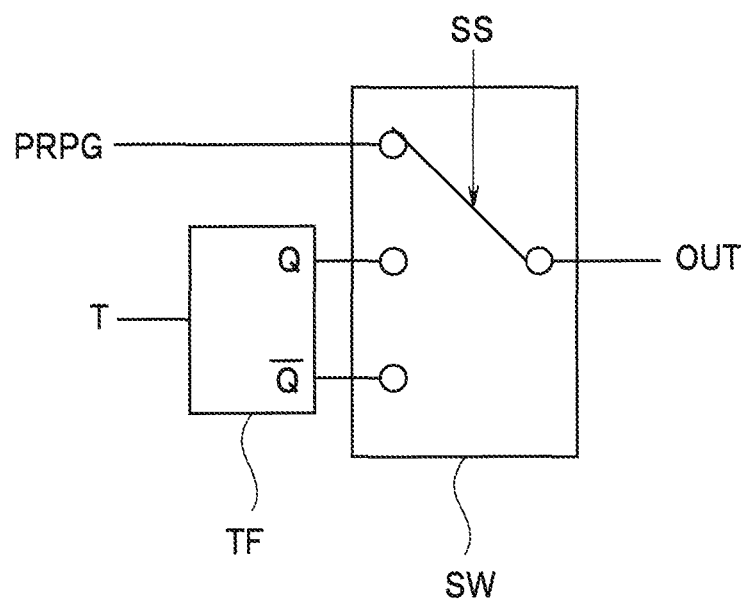
FIG. 3 is a diagram illustrating an example configuration of a switch using a toggle flip-flop.

FIG. 3 is a diagram illustrating an example configuration of a switch using a toggle flip-flop. FIG. 3 illustrates a configuration of one switch SW in the selector 5.

The switch SW allows inputs of a test pattern from the pattern generation circuit 3 and two outputs of a toggle flip-flop TF, and the switch SW selects any of the three inputs, and outputs the selected input as an output signal OUT. The toggle flip-flop TF outputs a Q output and an inversion output of the Q output in response to an input T.

At the time of diagnosis of the retention flip-flops RF, the two outputs of the toggle flip-flop TF, that is, the Q output and the inversion output of the Q output are alternately selected and outputted in response to a selection signal SS. Therefore, different values are retained in adjacent retention flip-flops RF.

Therefore, although in the case of FIG. 1, "0" or "1" is successively input to the respective scan chains SC and a scan shift is performed and the value of "0" or "1" is retained in all the retention flip-flop RF, in each scan chain SC in FIG. 3, "0" and "1" are alternately inputted and a scan shift is performed.

Also, although in FIG. 2 described above, power shut-down for an original purpose of the retention flip-flops RF is included in the processing, the power shut-down may be omitted if the retention flip-flop RF are mounted for retention and restoration for regular diagnosis of the retention flip-flops RF.

Furthermore, although in the above-described example, the control section 2 performs determination of agreement with an expected value using the MISR 8 configured to compress an output data string from the plurality of scan chains SC, whether or not values corresponding to fixed values "0" and "1" are obtained may be determined, without using the MISR 8.

Second Embodiment

Although the first embodiment relates to a semiconductor device capable of performing initial diagnosis of respective retention flip-flops RF, a second embodiment relates to a semiconductor device capable of performing regular diagnosis of respective retention flip-flops RF.

(Configuration)

Figure 4:
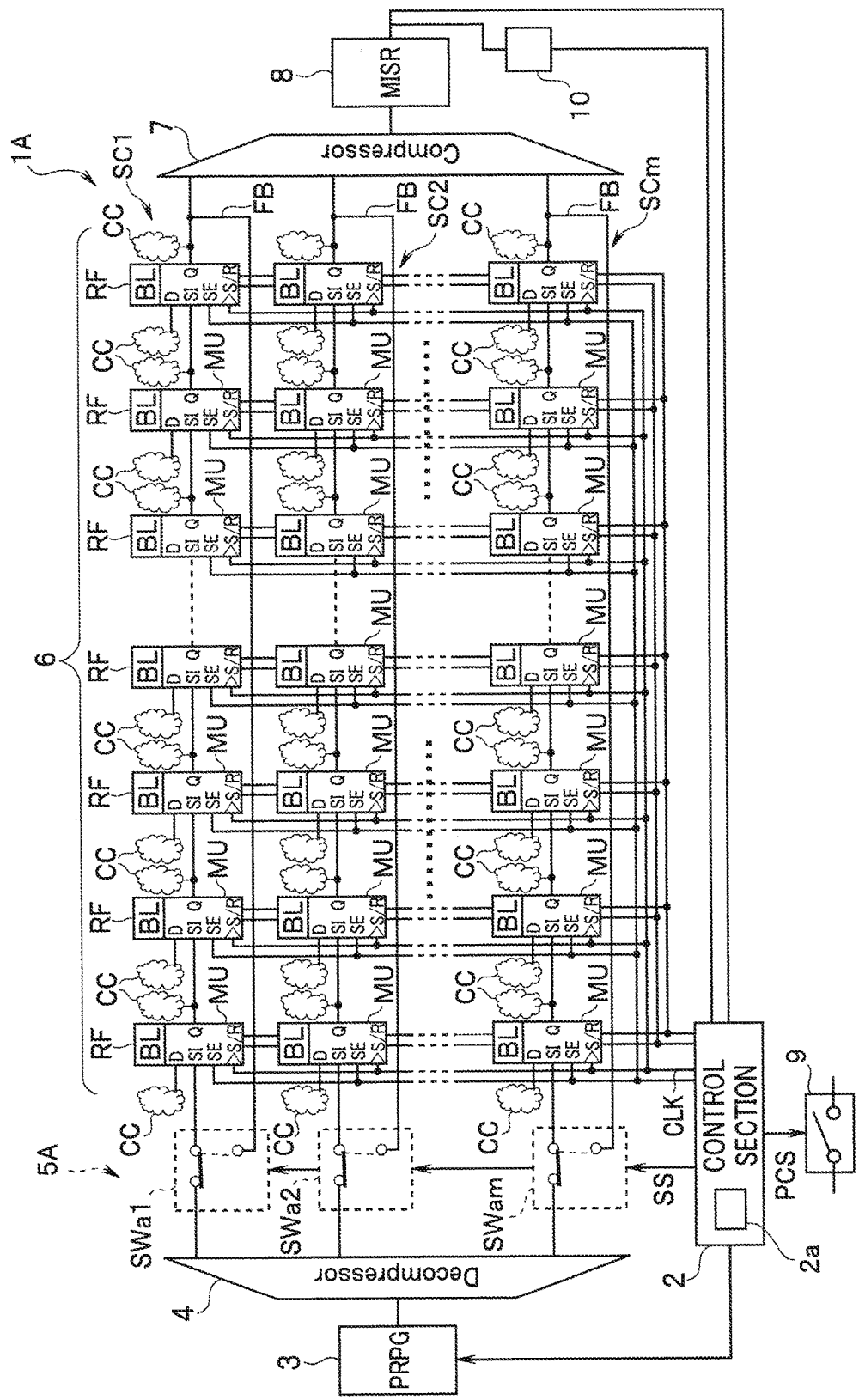
FIG. 4 is a circuit block diagram of a semiconductor device according to a second embodiment.

FIG. 4 is a circuit block diagram of a semiconductor device according to a second embodiment.

A semiconductor device 1A according to the second embodiment has a configuration that is similar to the configuration of the semiconductor device 1 according to the first embodiment, and thus, in FIG. 4, components that are the same as the components of the semiconductor device 1 according to the first embodiment are provided with reference numerals that are the same as reference numerals in the first embodiment and description of the components will be omitted, and only components that are different from components in the first embodiment will be described.

A selector 5A is provided at input sections of a plurality of scan chains SC in the semiconductor device 1A according to the second embodiment. The selector 5A includes a plurality of switches SWa1 to SWam. The respective switches SWa1 to SWam are provided corresponding to a plurality of scan chains SC1 to SCm, and provided at test pattern input sections of the respective scan chains SC1 to SCm.

Each of the switches SWa1 to SWam is a circuit configured to select either a signal from a pattern generation circuit 3 or a final output signal from a relevant scan chain SC and output the selected signal to the relevant scan chain SC. Which signal to be selected and outputted by the respective switches SWa1 to SWam is determined based on a selection signal SS from a control section 2. In other words, each of the switches SWa1 to SWam configures a switching circuit configured to fix an input of a relevant scan chain SC to an output data string of the relevant scan chain SC.

As described later, at the time of regular diagnosis of logic sections, in the respective switches SWa1 to SWam, the signal from the pattern generation circuit 3 is selected and outputted to the scan chains SC. At the time of diagnosis of retention flip-flops RF, the respective switches SWa1 to SWam select final output signals from the respective scan chains SC and supply the final output signals to the input sections of the scan chains SC.

An output of each scan chain SC is supplied to an MISR 8 via a compressor 7. A value of the MISR 8 can be stored in a register 10 in response to a control signal (not illustrated) from the control section 2. Then, the control section 2 can read the value stored in the register 10.

(Operation)

First, regular diagnosis of the logic sections will be described.

During operation of the semiconductor device 1A, the control section 2 saves data in retention sections BL of the plurality of retention flip-flops RF and then performs regular diagnosis of the logic sections. After the regular diagnosis, the operation of the semiconductor device 1A is resumed after restoration of the saved data in the main units MU. A result of the diagnosis is outputted by the control section 2 to another CPU in the semiconductor device 1A or the outside.

Figure 5:
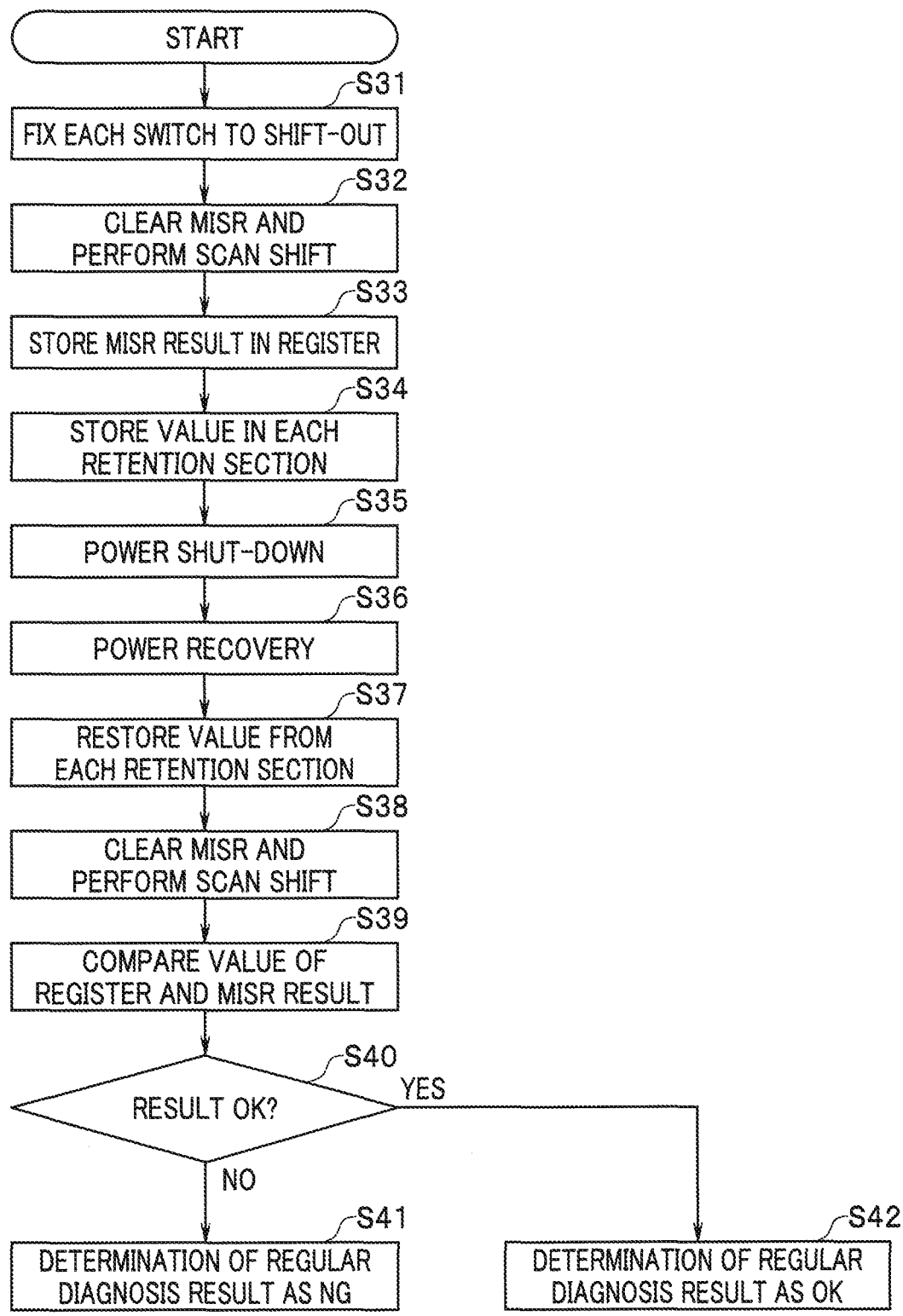
FIG. 5 is a flowchart illustrating an example of a flow of processing for regular diagnosis of retention flip-flops RF according to the second embodiment.

Next, processing for diagnosis of retention flip-flops in the semiconductor device 1A will be described. FIG. 5 is a flowchart illustrating an example of a flow of processing for regular diagnosis of the retention flip-flops RF.

At the time of diagnosis of the retention flip-flops, the control section 2 controls operation of the selector 5A and the plurality of scan chains 6.

Note that the semiconductor device 1A performs below-described regular diagnosis of the respective retention flip-flops RF after or before performance of regular diagnosis using a logic BIST. Here, diagnosis of whether or not retention performance of the retention sections BL of the retention flip-flops RF and save operation and restoration operation of the retention flip-flops RF correctly function is performed.

As described above, when a logic BIST is conducted for the logic sections, which are general circuits, the control section 2 outputs a selection signal SS for performing switching of the respective switches SWa1 to SWam to the selector 5A so as to select a signal from the pattern generation circuit 3 and a decompressor 4 and supply the signal to the input sections of the respective scan chains 6.

On the other hand, at the time of diagnosis of the retention flip-flops RF, the control section 2 outputs a selection signal SS for performing switching of the respective switches SWa1 to SWam to the selector 5A so as to select final output signals, that is, shift-out signals, from the respective scan chains SC and supply the final output signals to the input sections of the respective scan chains 6.

In regular diagnosis according to the present embodiment, in order to detect a failure in the retention sections BL of the retention flip-flops RF, the failure not occurring at the time of initial diagnosis, below-described diagnosis of the respective retention flip-flops RF is performed.

During operation of the semiconductor device 1A, regular diagnosis of the retention flip-flops RF, here, diagnosis of retention performance of the retention sections of the retention flip-flops RF and save operation and restoration operation of the retention flip-flops RF is performed with the operation interrupted.

Upon interruption of the operation of the semiconductor device 1A, the control section 2 fixes the respective switches SWa1 to SWam to a shift-out (S31) so that inputs of the respective scan chains SC are shift-out signals that are final output signals of the respective scan chains, before power shut-down or before transition to store processing before start of regular diagnosis of the logic sections. In FIG. 4, switching of the respective switches SWa1 to SWam is performed so that the final output signals of the respective scan chains SC are inputted to the input sections of the respective scan chains SC via feedback lines FB.

Next, the control section 2 clears the MISR 8 and performs a scan shift (S32). The scan shift is performed by supplying a shift enable (SE) signal to the respective retention flip-flops RF a predetermined number of times. As a result of the scan shift, values retained in main unit MU of the respective retention flip-flops RF when the operation of the semiconductor device 1A is interrupted are scan-shifted. The predetermined number of times is a number of times required for data in the respective retention flip-flops RF in the respective scan chains SC to retain respective values retained when the operation of the semiconductor device 1A is interrupted.

Then, the control section 2 stores a value of a result in the MISR 8 obtained as a result of the scan shift in S32, in a register 10 (S33).

The value of the MISR 8 obtained by the shift-out here is a value that is based on values retained in the main units MU of the respective retention flip-flops RF when the semiconductor device 1A is interrupted, and is retained in the register 10.

Furthermore, the values retained in the main units MU of the respective retention flip-flops RF return to original values before the shift since the respective data are shifted around the respective scan chains SC.

Subsequently, the control section 2 performs store processing on the respective retention flip-flops RF to store the values of the main units MU in the retention sections BL (S34).

Then, the control section 2 shuts down the power (S35).

Note that, instead of power shut-down, the control section 2 may perform regular diagnosis of the logic sections. When regular diagnosis is performed, the respective switches SWa are switched to the decompressor 4 side.

The control section 2 performs power recovery (S36). Note that, when the regular diagnosis of the logic sections is finished, the values of the main units MU have been changed.

Then, the control section 2 supplies a restore (R) signal to the respective retention flip-flops RF to restore values from the retention sections BL (S37). If no failure occurs in the retention flip-flops RF, the main units MU should be restored to a state before the power shut-down or before start of the regular diagnosis of the logic sections.

Note that, when the regular diagnosis of the logic sections is finished, the respective switches SWa are switched again to the final output signals, that is, the shift-out signals, of the scan chains SC.

Then, the control section 2 clears the value of the MISR 8, performs a scan shift (S38) and compares the value of the register 10 and a result of the MISR 8 (S39).

The control section 2 determines whether or not a result of the comparison between the value of the register 10 and the value of the MISR 8 is "OK", that is, the value of the MISR 8 and the value of the register 10 agree with each other (S40), and if the result of the comparison is "NG" (S40: NO), the control section 2 determines that a result of the regular diagnosis is "NG" (S41).

If the result of the comparison between the value of the MISR 8 and the value of the register 10 is "OK" (S40: YES), the control section 2 determines that the result of the regular diagnosis is "OK" (S42).

Here, if the value of the MISR 8 obtained by clearing the value of the MISR 8 and performing a scan shift and the value retained in the register 10 before the power shutdown (or before the diagnosis) are equal to each other, results of the restore are equal to values of the main units MU before the store.

Also, since the scan shift causes the data of the values to be shifted around the respective scan chains and the main units MU of the respective retention flip-flops RF return to respective original values, the data can be used as restored data immediately after re-start of the semiconductor device 1A.

Therefore, the control section 2 configures a diagnosis circuit configured to perform data restoration by restoring data saved in the retention sections BL of the respective retention flip-flops RF (data when operation of the semiconductor device 1A is interrupted) from the retention sections BL, and after the data restoration, perform diagnosis of the retention flip-flops RF by performing comparison to determine whether or not a first value of an output data string obtained as a result of a scan shift in the plurality of scan chains SC before the save (data when operation of the semiconductor device 1A is interrupted) and a second value of an output data string obtained as a result of a scan shift of data in the plurality of scan chains SC after the restoration agree with each other.

The first value is a value obtained as a result of a scan shift of an output data string of the plurality of scan chains SC, the output data string being inputted from the selector 5. The second value is a value of an output data string obtained as a result of a scan shift of data restored from the retention sections BL.

As described above, according to the above-described embodiment, a semiconductor device and a semiconductor device diagnosis method capable of performing diagnosis of whether or not a defect or a failure occurs in retention performance of retention sections of retention flip-flops and save operation and restoration operation of the retention flip-flops as regular diagnosis can be provided.

In particular, if retention flip-flops are utilized in regular diagnosis of the logic sections, unless retention operation and restoration operation are ensured, malfunction of the semiconductor device 1A may occur in restart of the semiconductor device 1A after the regular diagnosis; however, in the above-described embodiment, diagnosis of, e.g., retention performance of the retention sections of the retention flip-flops RF can be performed, enabling prevention of malfunction of the semiconductor device 1A after regular diagnosis.

Figure 5A:
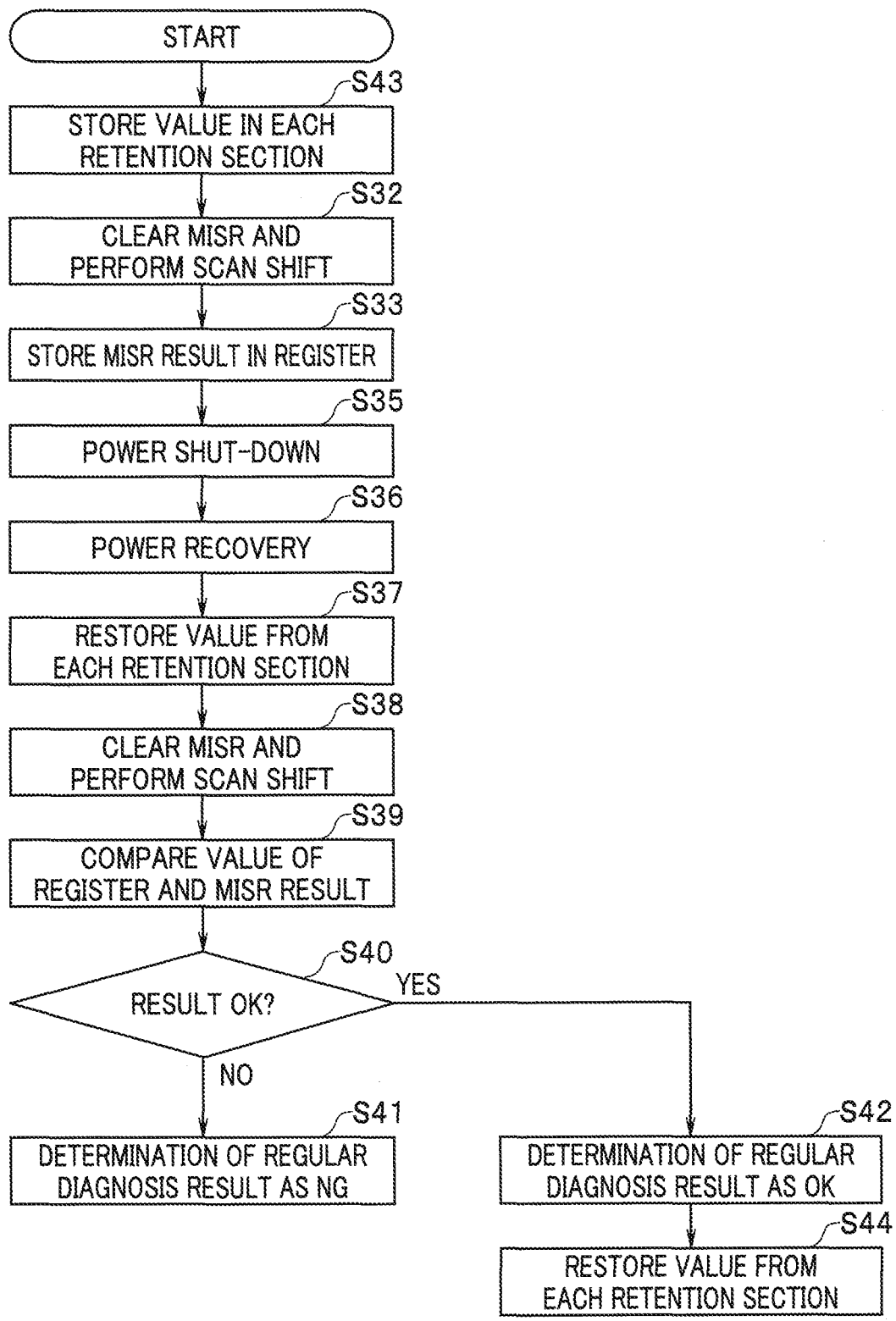
FIG. 5A is a flowchart illustrating another example of a flow of processing for regular diagnosis of the retention flip-flops RF.

Note that, instead of FIG. 5, the processing illustrated in FIG. 5A may be performed. FIG. 5A is a flowchart illustrating another example of a flow of processing for regular diagnosis of the retention flip-flops RF. In FIG. 5A, steps of the processing that are the same as the steps in FIG. 5 are provided with step numbers that are the same as the step numbers in FIG. 5, and description of the steps will be omitted.

In other words, in the modification in FIG. 5, before the processing in S32, the control section 2 performs subjects the respective retention flip-flops RF to store processing to store values of the main units MU in the respective retention sections BL (S43). Then, after the processing in S33, the control section 2 performs power shut-down (S35).

Subsequently, the processing after S35 is similar to the processing in FIG. 5, and if it is determined in S42 that a result of the regular diagnosis is "OK", the control section 2 supplies a restore (R) signal to the respective retention flip-flops RF to restore the values from the retention sections BL (S44).

The processing in FIG. 5A also enables regular diagnosis of the retention flip-flops RF.

Third Embodiment

Although the first embodiment relates to a semiconductor device capable of performing initial diagnosis of respective retention flip-flops RF and the second embodiment relates to a semiconductor device capable of performing regular diagnosis of respective retention flip-flops RF, the third embodiment relates to a semiconductor device capable of performing both initial diagnosis and regular diagnosis of respective retention flip-flops RF.

(Configuration)

Figure 6:
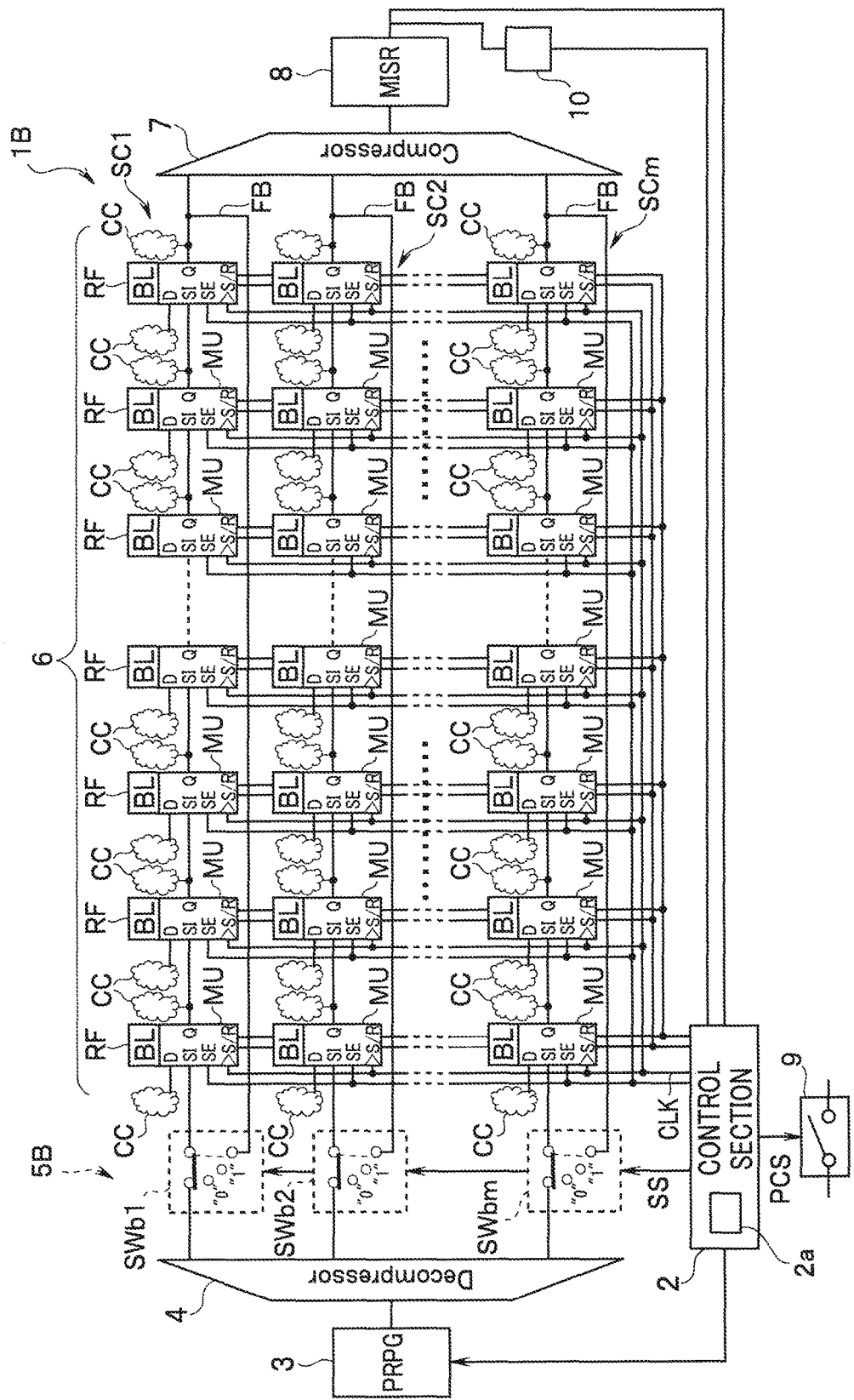
FIG. 6 is a circuit block diagram of a semiconductor device according to a third embodiment.

FIG. 6 is a circuit block diagram of a semiconductor device according to a third embodiment.

A semiconductor device 1B according to a third embodiment has a configuration that is similar to the configuration of the semiconductor device 1A according to the second embodiment, and thus, in FIG. 6, components that are the same as the components of the semiconductor device 1A according to the second embodiment are provided with reference numerals that are the same as reference numerals of the components of the semiconductor device 1A, and description of the components will be omitted, and only components that are different from the components of the semiconductor device 1A will be described.

A selector 5B is provided at input sections of a plurality of scan chains SC in the semiconductor device 1B according to the third embodiment. The selector 5B includes a plurality of switches SWb1 to SWbm. The respective switches SWb1 to SWbm are provided corresponding to the plurality of scan chains SC1 to SCm, and are provided at test pattern input sections of the scan chains SC1 to SCm.

Each of the switches SWb1 to SWbm is a circuit configured to select a signal from a pattern generation circuit 3, "0", "1" or a final output signal of the relevant scan chain SC and output the selected signal to the relevant scan chain SC. Which signal to be selected by each of the switches SWb1 to SWbm is determined based on a selection signal SS from the control section 2.

In other words, each of the switches SWb1 to SWbm configures a switching circuit capable of performing switching so as to fix inputs to a plurality of scan chain SC to a predetermined value (1 or 0) or an output data string of the plurality of scan chains SC.

As described later, at the time of initial diagnosis of logic sections, in each of the switches SWb1 to SWbm, the signal from the pattern generation circuit 3 is selected and outputted to the relevant scan chain SC. At the time of initial diagnosis of retention flip-flops RF, in each of the switches SWb1 to SWbm, "0" or "1", which is a fixed value, is selected and outputted to the relevant scan chain SC. At the time of regular diagnosis of the retention flip-flops RF, a final output signal of each scan chain SC is selected and outputted to the scan chain SC.

(Operation)

Initial diagnosis of the respective retention flip-flops RF in the semiconductor device 1B is performed by selection of "0" or "1" in each of the switches SWb1 to SWbm and operation of the control section 2 in such a manner as described with reference to FIGS. 1 and 2.

Then, regular diagnosis of the respective retention flip-flops RF in the semiconductor device 1B is performed by selection of final output signals of the respective scan chains SC in the respective switches SWb1 to SWbm and operation of the control section 2 in such a manner as described with reference to FIGS. 4 and 5.

Therefore, the control section 2 configures a diagnosis circuit configured to perform data restoration by restoring data saved in retention sections BL of the respective retention flip-flops RF from the retention sections BL, and after the data restoration, perform diagnosis of the retention flip-flops RF by performing comparison to determine whether or not a first value of an output data string obtained as a result of a scan shift in the plurality of the scan chain SC before the save and a second value of an output data string obtained as a result of a scan shift of data in the plurality of scan chains SC after the restoration agree with each other.

Where the respective switches SWb fix inputs to the plurality of scan chains SC to a predetermined value (1 or 0), a first value is an expected value of an output data string obtained as a result of a scan shift of a predetermined value (1 or 0) in the plurality of scan chains SC after setting of the predetermined value (1 or 0) as the inputs of the plurality of scan chains SC via the respective switches SWb, and the second value is a value of an output data string obtained as a result of input of a predetermined value (1 or 0) restored from the retention sections BL to the plurality of scan chains SC and a scan shift.

Where the respective switches SWb fix the inputs to the plurality of scan chains SC to the output data strings of the respective scan chains SC, the first value is a value obtained as a result of input of the output data strings of the respective scan chains SC to the plurality of scan chains SC via the respective switches SWb and a scan shift, and the second value is a value of a second output data string obtained as a result of input of data restored from the retention sections BL to the plurality of scan chains SC and a scan shift.

As described above, according to the above-described embodiment, a semiconductor device and a semiconductor device diagnosis method capable of performing diagnosis of whether or not a defect or a failure occurs in retention performance of retention sections of retention flip-flops and save operation and restoration operation of the retention flip-flops as initial diagnosis and regular diagnosis can be provided.

Next, modifications of the respective embodiments described above will be described.

(Modification 1)

Although in the respective embodiments described above, each of all of the scan chains SC in the semiconductor device includes a plurality of retention flip-flops RF alone, a semiconductor device according to present modification 1 includes a scan chain including a plurality of non-retention flip-flops alone.

Figure 7:
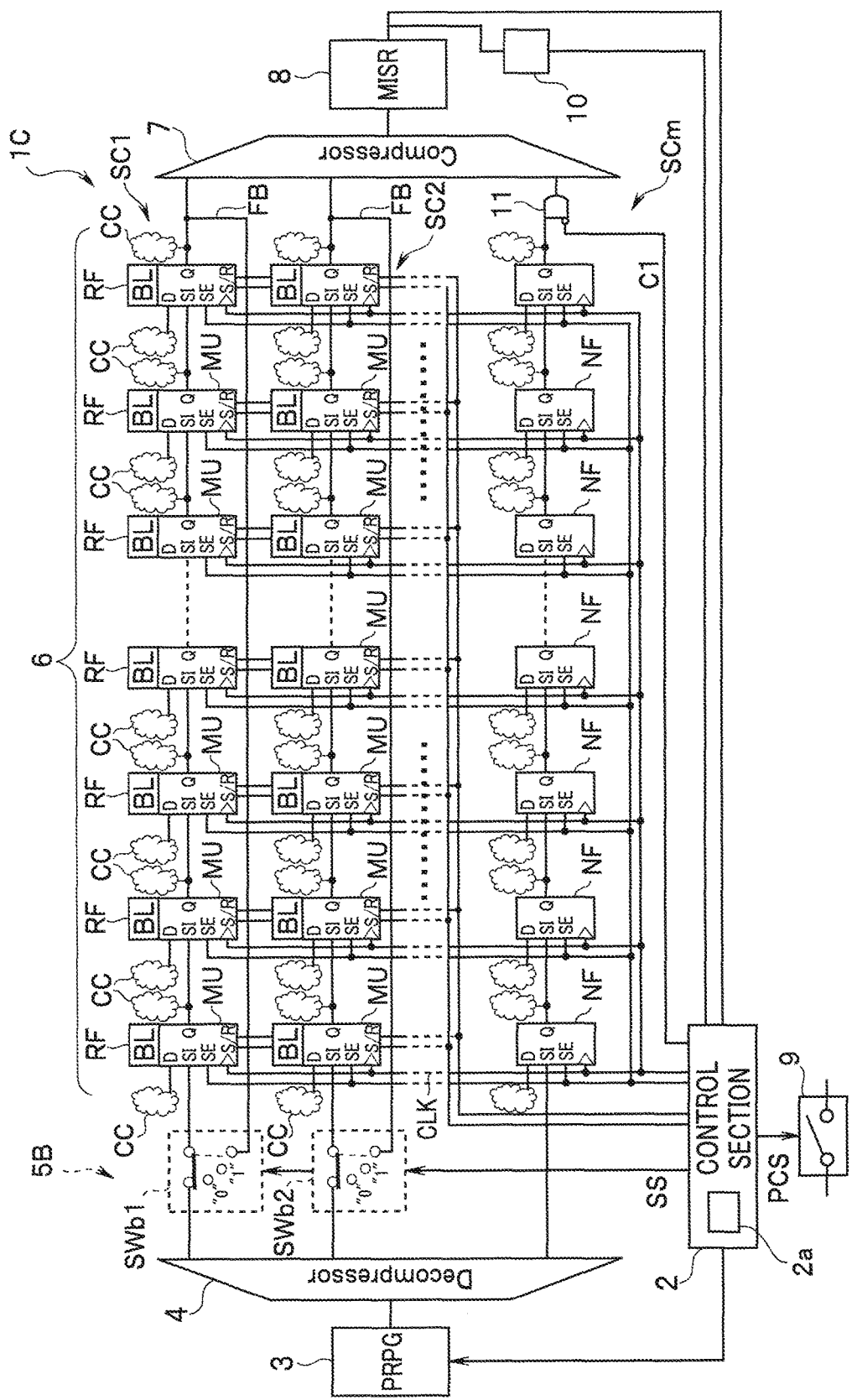
FIG. 7 is a circuit block diagram of a semiconductor device according to modification 1.

FIG. 7 is a circuit block diagram of a semiconductor device according to present modification 1.

The semiconductor device 1C according to modification 1 includes a plurality of scan chains SC, but a part of the plurality of scan chains SC includes a plurality of retention flip-flops RF, and a remaining part of the plurality of scan chains SC includes a plurality of non-retention flip-flops NF. FIG. 7 illustrates that a scan chain SCm includes a plurality of non-retention flip-flops NF. In other words, the plurality of scan chains SC include a non-retention flip-flop scan chain including non-retention flip-flops NF alone.

An AND circuit 11 is provided at an output section of the scan chain SCm. A final output signal of the scan chain SCm is inputted to one of two inputs of the AND circuit 11, and a predetermined output signal C1 from a control section 2 is inputted to the other of the two inputs of the AND circuit 11. Here, the output signal C1 is inputted in an inverted manner to the AND circuit 11.

Where the predetermined output signal C1 is "1", an output of the AND circuit 11 is constantly "0", an output of the scan chain SCm is masked and thus becomes constantly "0". At the time of diagnosis of the retention flip-flops RF, the control section 2 sets the predetermined output signal C1 as "1", and the output of the scan chain SCm thus becomes constantly "0" and is inputted to an MISR 8.

Therefore, the AND circuit 11 configures a switching circuit configured to mask an output data string obtained as a result of a scan shift of data of a non-retention flip-flop scan chain to switch the output data string to a predetermined value.

Although a data compression value of an amount corresponding to the number of the plurality of scan chains SC is inputted to the MISR 8, the output of the scan chain SCm including the non-retention flip-flops NF is fixed to a predetermined value. In other words, a value obtained from a data string including an output data string resulting from a scan shift in a non-retention flip-flop scan chain is stored in the MISR 8.

Also, when the control section 2 sets the predetermined output signal C1 to "0", the output of the AND circuit 11 becomes the final output signal of the scan chain SCm. Therefore, during normal operation, at the time of diagnosis of logic sections, the control section 2 sets the predetermined output signal C1 to "0".

The retention flip-flops RF are large in circuit area compared to general flip-flops, and may cause an increase in chip costs. Therefore, in important circuits such as a circuit for initial setting processing performed in a semiconductor device, a scan chain SC is configured using retention flip-flops RF and in other circuits, a scan chain SC using non-retention flip-flops NF are used, enabling suppression of an increase in chip costs.

According to present modification 1, since the output of the scan chain SC of the non-retention flip-flop NF can be fixed to a predetermined value, diagnosis of e.g., retention performance of the retention sections of the retention flip-flops RF can be performed.

Note that, although in the above-described example, the output of the scan chain SC of the non-retention flip-flops NF is fixed to "0", the output of the scan chain SC may be fixed to "1".

Furthermore, in the case of initial diagnosis of the retention flip-flops RF, the output of the AND circuit 11 may be set so as to agree with "0" or "1" shifted through the scan chains SC of all the retention flip-flops RF.

Note that, although FIG. 7 indicates a case where modification 1 is applied to the semiconductor device 1C having a configuration that is similar to the configuration of the semiconductor device according to the third embodiment, present modification 1 is applicable also to any of the semiconductor devices according to the first and second embodiments and the other modifications.

(Modification 2)

Although in the respective scan chains SC in each of the embodiments described above, all of the flip-flops are retention flip-flops RF, in the present modification, in all or a part of a plurality of scan chains SC, retention flip-flops RF and non-retention flip-flops NF are mixed. Namely, retention flip-flops RF and non-retention flip-flops NF are included in a mixed manner in a same scan chain. In other words, a scan chain SC including retention flip-flops RF includes non-retention flip-flops NF.

Figure 8:
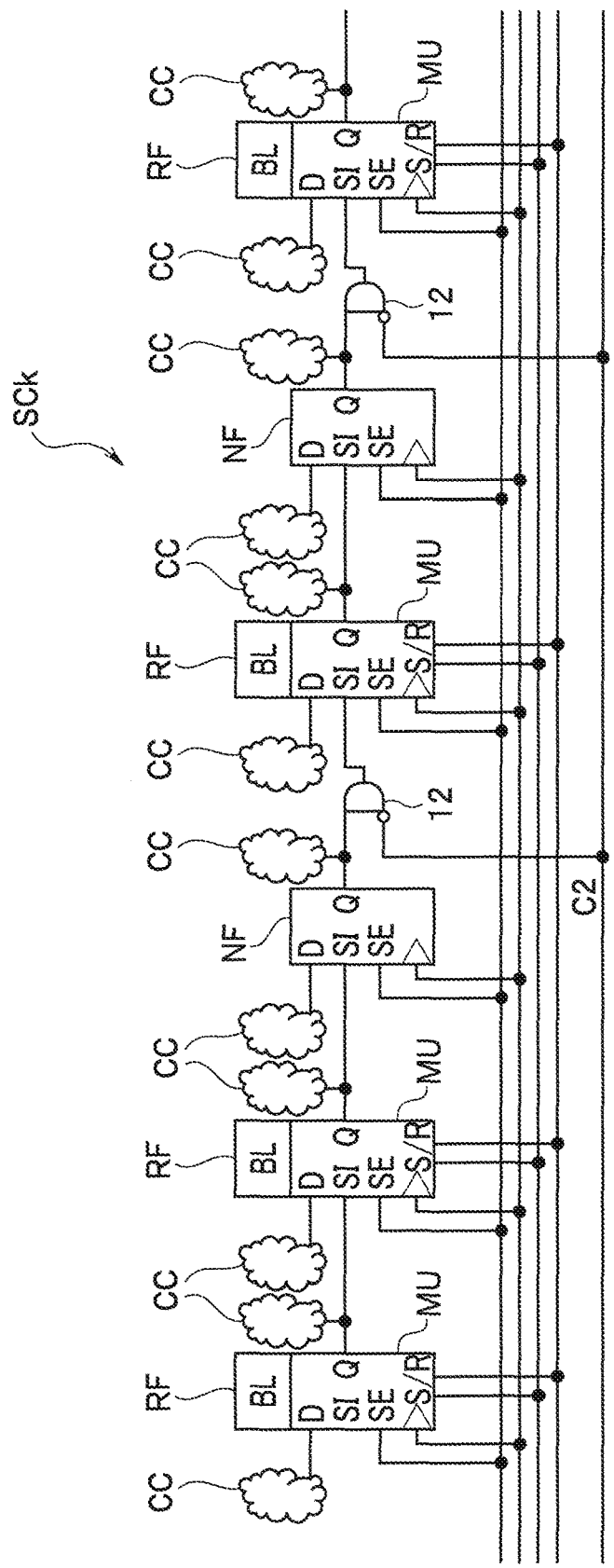
FIG. 8 is a circuit diagram of a part of a scan chain SC according to modification 2.

FIG. 8 is a circuit diagram of a part of scan chains SC according to present modification 2. A scan chain SCk is configured by cascade connection of retention flip-flops RF and non-retention flip-flops NF in a mixed manner.

Then, an AND circuit 12 is provided at an output section of each of the non-retention flip-flops NF. An output of an upstream flip-flop is inputted to one of two inputs of the AND circuit 12, and a predetermined output signal C2 from a control section 2 is inputted to the other of the two inputs of the AND circuit 12. The output signal C2 is inputted in an inverted manner to the other of the two inputs of the AND circuit 12.

The control section 2 outputs "1" as the output signal C2 only at a first clock in a scan shift. When the output signal C2 is "1", an output of each of the AND circuits 12 becomes "0". Therefore, each AND circuit 12 configures a switching circuit configured to switch an output of a non-retention flip-flop NF to a predetermined value.

In other words, data in a non-retention flip-flop NF is masked and fixed to "0", and thus scan data supplied to the MISR 8 does not become indefinite.

Note that, although in modification 1, mask processing by the AND circuit 11 is consistently performed during a scan shift, in present modification 2, mask processing by the AND circuits 12 is performed only at a timing of a first clock at which a scan shift is started.

Furthermore, although in the above-described example, the output of the scan chain SC including the non-retention flip-flops is fixed to "0", it is possible to use an OR circuit, and supply "1" to the OR circuit to fix the output of the scan chain SC to "1".

Note that present modification 2 is applicable to any of the semiconductor devices according to the first and second embodiments and the other modifications.

(Modification 3)

Although in the respective embodiments and the respective modifications described above, the plurality of scan chains SC have a same length, it is possible that a length of a part of a plurality of scan chains SC is not a maximum scan chain length of the plurality of scan chains SC. In order to enable diagnosis of retention flip-flops RF even in such case, in present modification 3, a shift enable (SE) input, which provides shift clocks, is masked.

Figure 9:
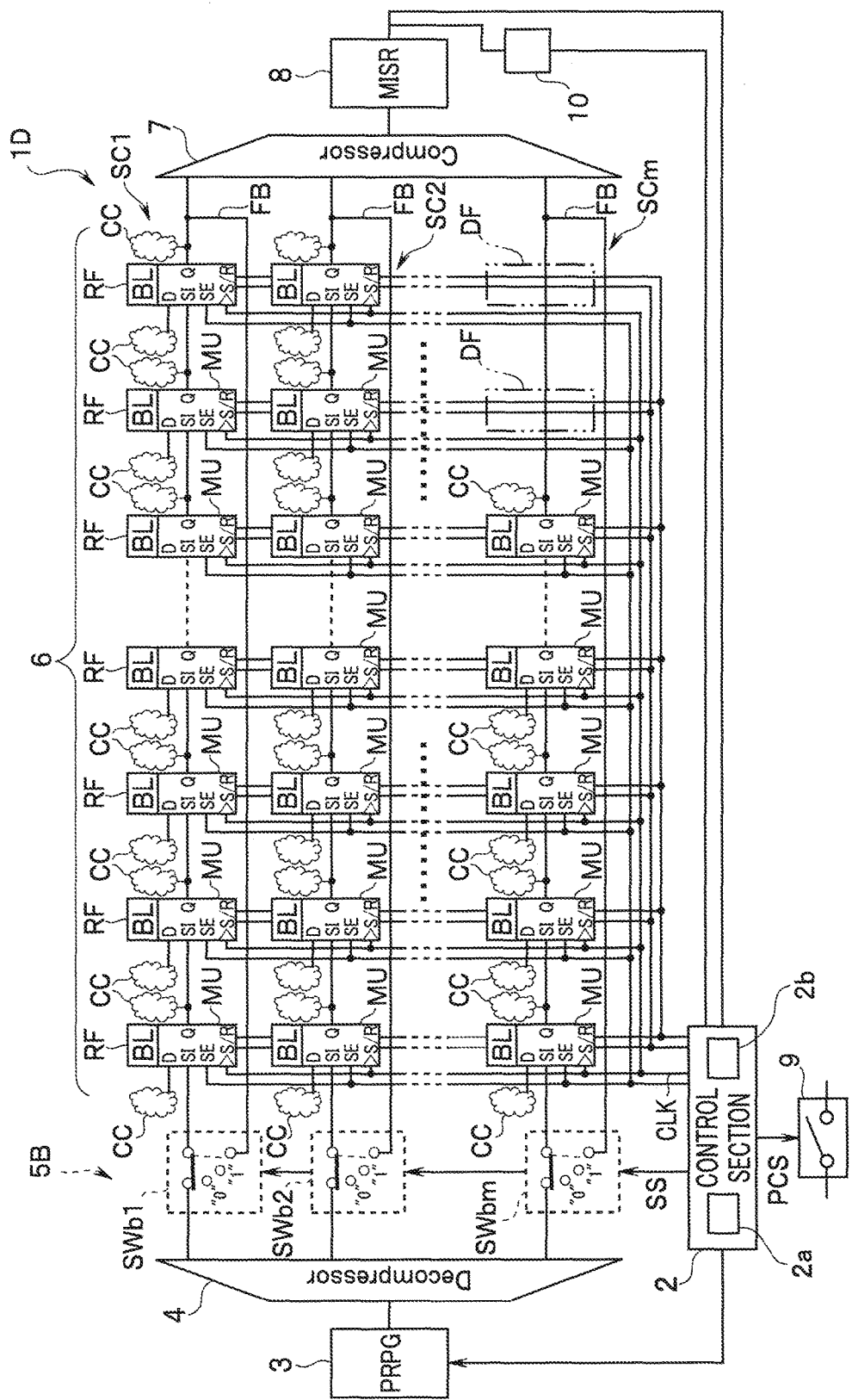
FIG. 9 is a circuit block diagram of a semiconductor device according to modification 3.

FIG. 9 is a circuit block diagram of a semiconductor device according to present modification 3.

A semiconductor device 1D according to the modification 3 includes a plurality of scan chains SC, but a part of the plurality of scan chains SC is shorter than a maximum scan chain length. The maximum scan chain length means a length of a scan chain including a largest number of flip-flops from among the plurality of scan chains SC. In FIG. 9, the plurality of scan chains SC except the scan chain SCm has a same scan chain length, and only the scan chain SCm does not have the maximum scan chain length. In other words, in FIG. 9, no retention flip-flop RF is provided in each of parts DF indicated by alternate long and two short dashes lines, and the scan chain SCm is shorter than the maximum scan chain length by a length corresponding to two retention flip-flops RF.

In the scan chain SCm, upon shift operation for the maximum scan chain length being performed, data is fed back to an input of the scan chain SCm in such a manner that the data is shifted, resulting in shifting of data.

Therefore, a control section 2 masks a shift enable (SE) signal for the amount of the number of retention flip-flops RF (here, for the amount of two retention flip-flops RF) that is a difference between the length of the scan chain SCm and the maximum scan chain length so as to prevent output of the signal. The mask processing is performed by a mask circuit 2b in the control section 2.

In other words, the control section 2, which is a diagnosis circuit, includes a mask circuit 2b configured to mask a shift clock for a scan shift for an amount of a difference between a maximum chain length and a chain length of a scan chain that is shorter than the maximum chain length among a plurality of scan chains SC, for the scan chain SC that is shorter than the maximum chain length.

As a result, shift operation for the amount of the maximum scan chain length is performed in the other scan chains SCm, but, as described above, the control section 2 performs mask processing of the amount of a difference between the maximum chain length and the chain length of the scan chain that is shorter than the maximum chain length for a shift enable (SE) signal for the scan chain SCm, and thus, data is not shifted in the scan chain SCm and original data is restored.

Therefore, when data in the respective retention flip-flops RF are restored, a shift enable (SE) signal, which provides shift clocks, is provided to a scan chain SC that is shorter than a maximum chain length in such a manner that the amount of a difference between the maximum chain length and the scan chain SC, of the shift enable (SE) signal is masked, to restore correct original data.

Note that, although FIG. 9 indicates a case where modification 3 is applied to the semiconductor device 1D having a configuration that is similar to the configuration of the semiconductor device according to the third embodiment, present modification 3 is applicable also to any of the semiconductor devices according to the first and second embodiments and the other modifications.

(Modification 4)

Present modification 4 is a modification of modification 3. Although in modification 3, a shift enable (SE) signal, which provides shift clocks, is provided to a scan chain SC that is shorter than a maximum chain length in such a manner that the amount corresponding to a difference between the maximum chain length and the scan chain SC, of the shift enable (SE) signal is masked, in present modification 4, dummy flip-flops are inserted to a scan chain SC that is shorter than a maximum chain length according to a difference between the maximum chain length and the scan chain SC.

In the case of FIG. 9, a dummy flip-flop is added and inserted in each of two parts of DF indicated by alternate long and two short dashes lines. Each of the dummy flip-flops is set so as to output "0" or "1".

In other words, the semiconductor device includes one or two or more dummy flip-flops provided in a scan chain that is shorter than a maximum chain length from among a plurality of scan chains SC, to make the maximum chain length and a chain length of the scan chain that is shorter than the maximum chain length equal to each other.

In a scan chain SC that is shorter than a maximum chain length such as indicated in present modification 4, also, correct original data are restored.

Note that, although FIG. 9 indicates a case where modification 4 is applied to the semiconductor device 1D having a configuration that is similar to the configuration of the semiconductor device according to the third embodiment, present modification 4 is applicable also to any of the semiconductor devices according to the first and second embodiments and the other modifications.

As described above, according to the respective embodiments and the respective modifications described above, a semiconductor integrated circuit and a semiconductor integrated circuit diagnosis method capable of performing diagnosis of whether or not a defect or a failure occurs in retention performance of retention sections of retention flip-flops and save operation and restoration operation of the retention flip-flops.

In particular, the above-described embodiments and modifications are effective in, e.g., diagnosis of retention flip-flops mounted in a semiconductor device as an in-vehicle product, reliability of which is seen as important.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
    a plurality of scan chains each including a retention flip-flop; and
    a diagnosis circuit configured to perform restoration of data saved in a retention section of the retention flip-flop by reading the data from the retention section, and after the restoration of the data, perform diagnosis of the retention flip-flop by performing comparison to determine whether or not a first value of a first output data string obtained as a result of a scan shift in each of the plurality of scan chains before the save of the data in the retention section and a second value of a second output data string obtained as a result of a scan shift of the data in each of the plurality of scan chains after the restoration of the data agree with each other, wherein the data is "0" or "1";
    a switching circuit configured to perform switching of inputs to each of the plurality of scan chains to the "0" or "1" is provided;
    the first value is an expected value of the first output data string obtained as a result of a scan shift of the "0" or "1" in the plurality of scan chains after setting of the "0" or "1" in the inputs to the plurality of scan chains via the switching circuit;
    the second value is a value of the second output data string obtained as a result of input of the data read and restored from the retention section to the plurality of scan chains and a scan shift of the data, and
    after the diagnosis circuit performs diagnosis of the retention flip-flop by performing comparison to determine whether or not the first value and the second value when the inputs to the plurality of scan chains are fixed to one of the "0" and the "1" by the switching circuit agree with each other, the diagnosis circuit performs diagnosis of the retention flip-flop by performing comparison to determine whether or not the first value and the second value when the inputs to the plurality of scan chains are fixed to another of the "0" and the "1" by the switching circuit agree with each other.

2. The semiconductor integrated circuit according to claim 1, comprising a logic BIST controller configured to perform diagnosis of a logic section of the semiconductor integrated circuit, wherein:
    a test pattern for diagnosis of the logic section can be inputted to each of the plurality of scan chains; and
    the logic BIST controller performs diagnosis of the logic section based on the test pattern.

3. The semiconductor integrated circuit according to claim 1, wherein:
    the switching circuit can perform switching so as to fix the inputs to the plurality of scan chains to the "0" or "1" or the respective first output data strings of the plurality of scan chains;
    if the switching circuit fixes the inputs to the plurality of scan chains to the "0" or "1", the first value is an expected value of the first output data string obtained as a result of a scan shift of the "0" or "1" after setting of the "0" or "1" in the inputs to the plurality of scan chains via the switching circuit, and the second value is a value of the second output data string obtained as a result of a scan shift of the "0" or "1" read and restored from the retention section; and
    if the switching circuit fixes the inputs to the plurality of scan chains to the respective first output data strings of the respective scan chains, the first value is a value obtained as a result of a scan shift of the first output data strings of the respective scan chains via the switching circuit, and the second value is a value of the second output data string obtained as a result of a scan shift of the data read and restored from the retention section.

4. The semiconductor integrated circuit according to claim 1, comprising:
    a non-retention flip-flop scan chain including a non-retention flip-flop alone; and
    a second switching circuit configured to switch a third output data string obtained as a result of a scan shift of data of the non-retention flip-flop scan chain, to a first predetermined value,
    wherein the first value and the second value are each obtained as a result of a scan shift of a data string including the third output data string in the non-retention flip-flop scan chain.

5. The semiconductor integrated circuit according to claim 1, wherein:
    each of the plurality of scan chains includes a non-retention flip-flop; and
    a second switching circuit configured to switch an output of the non-retention flip-flop to a first predetermined value is provided.

6. The semiconductor integrated circuit according to claim 1, wherein:
    one or two or more dummy flip-flops provided in a scan chain that is shorter than a maximum chain length from among the plurality of scan chains, the one or two or more dummy flip-flops making the maximum chain length and a chain length of the scan chain that is shorter than the maximum chain length equal to each other, are provided.

7. A diagnosis method for a semiconductor integrated circuit including a plurality of scan chains each including a retention flip-flop, the method comprising:
    performing restoration of data saved in a retention section in the plurality of scan chains by reading the data from the retention section; and
    after the restoration of the data, performing diagnosis of the retention flip-flop by performing comparison to determine whether or not a first value of a first output data string obtained as a result of a scan shift in each of the plurality of scan chains before the save of the data in the retention section and a second value of a second output data string obtained as a result of a scan shift of the data in each of the plurality of scan chains after the restoration agree with each other, wherein the data "0" or "1";

the first value is an expected value of the first output data string obtained as a result of a scan shift of the "0" or "1" in the plurality of scan chains after setting of the "0" or "1" in the inputs to the plurality of scan chains via a switching circuit configured to perform switching of inputs to each of the plurality of scan chains to the "0" and "1"; and the second value is a value of the second output data string obtained as a result of input of the data read and restored from the retention section to the plurality of scan chains and a scan shift of the data, the method further comprising, after performing diagnosis of the retention flip-flop by performing comparison to determine whether or not the first value and the second value when the inputs to the plurality of scan chains are fixed to one of the "0" and the "1" by the switching circuit agree with each other, performing diagnosis of the retention flip-flop by performing comparison to determine whether or not the first value and the second value when the inputs to the plurality of scan chains are fixed to another of the "0" and the "1" by the switching circuit agree with each other.

8. The diagnosis method for a semiconductor integrated circuit according to claim 7, wherein:

the switching circuit can perform switching so as to fix the inputs to the plurality of scan chains to the "0" or "1" or the respective first output data strings of the plurality of scan chains;

if the switching circuit fixes the inputs to the plurality of scan chains to the "0" or "1", the first value is an expected value of the first output data string obtained as a result of a scan shift of the "0" or "1" in the plurality of scan chains after setting of the "0" or "1" in the inputs to the plurality of scan chains via the switching circuit, and the second value is a value of the second output data string obtained as a result of input of the "0" or "1" read and restored from the retention section to the plurality of scan chains and a scan shift of the "0" or "1"; and if the switching circuit fixes the inputs to the plurality of scan chains to the respective first output data strings of the respective scan chains, the first value is a value obtained as a result of input of the first output data strings of the respective scan chains to the plurality of scan chains via the switching circuit and a scan shift of the first output data strings, and the second value is a value of the second output data string obtained as a result of input of the data read and restored from the retention section to the plurality of scan chains and a scan shift of the data.

* * * * *